United States Patent [19]

Kosa

[11] Patent Number: 5,006,909
[45] Date of Patent: Apr. 9, 1991

[54] DRAM WITH A VERTICAL CAPACITOR AND TRANSISTOR

[75] Inventor: Yasunobu Kosa, Austin, Tex.
[73] Assignee: Motorola, Inc., Schaumburg, Ill.
[21] Appl. No.: 429,952
[22] Filed: Oct. 30, 1989
[51] Int. Cl.[5] .......................................... H01L 29/78
[52] U.S. Cl. .................................. 357/23.6; 357/41; 357/55
[58] Field of Search ...................... 357/23.6, 41, 52, 55

[56] References Cited

U.S. PATENT DOCUMENTS 4,894,696  1/1990  Takeda et al. .................. 357/23.6

FOREIGN PATENT DOCUMENTS

| 56-100523 | 1/1983 | Japan | 357/23.6 |
| 59-194656 | 4/1986 | Japan | 357/23.6 |
| 63-51667 | 3/1988 | Japan | 357/23.6 |
| 63-260166 | 10/1988 | Japan | 357/23.6 |

Primary Examiner—Andrew J. James
Assistant Examiner—Donald L. Monin
Attorney, Agent, or Firm—James L. Clingan, Jr.

[57] ABSTRACT

A dynamic random access memory array is formed using vertical transistors and capacitors. The capacitor for each memory cell has one electrode formed in a lower region of a pillar and a second electrode in a conductive fill surrounding the lower region of the pillar. The transistor of each cell has its source, drain, and channel also formed in a single pillar. The gate of each cell is a conductive layer surrounding the channel. The conductive layer is above and insulated from the conductive fill. The conductive layer is also conveniently the word line which continuously extends from one cell in a particular row to the next cell of that row. Contact to the cell is made to the top of the pillar which is doped to the same type as that of the lower region of the pillar. The areas between the pillars is filled with insulating material but the top of the pillar is exposed. Metal bit lines are thus conveniently formed in contact with the top of the pillar which is the input/output for the cell.

12 Claims, 6 Drawing Sheets

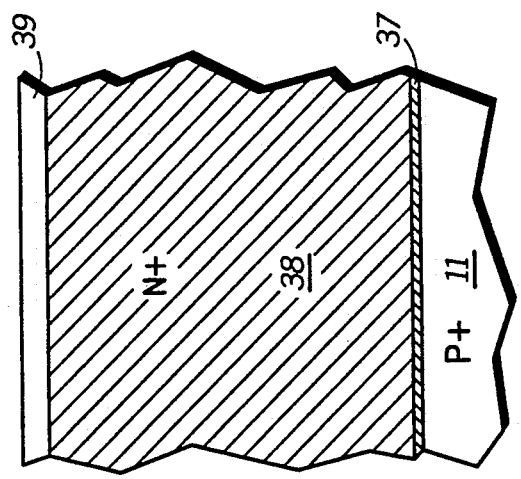
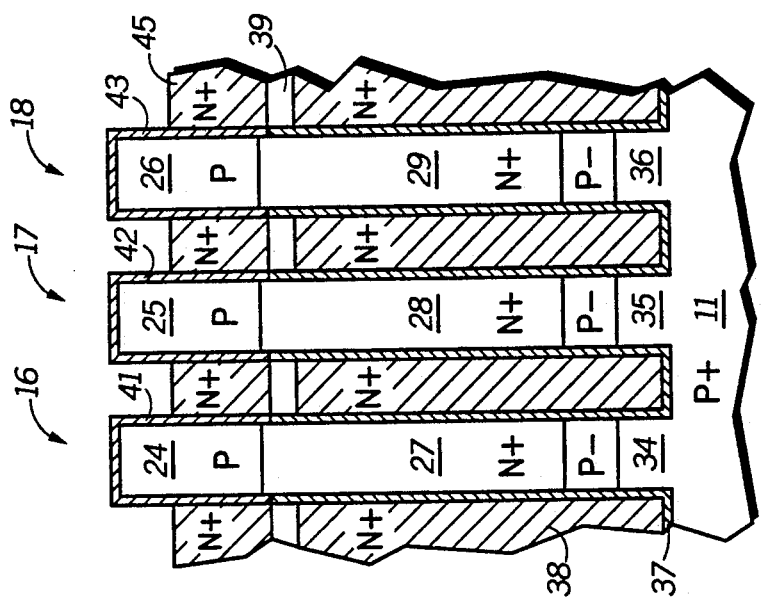
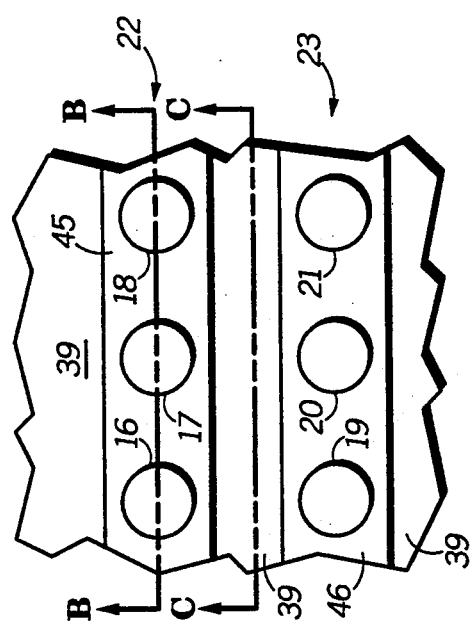

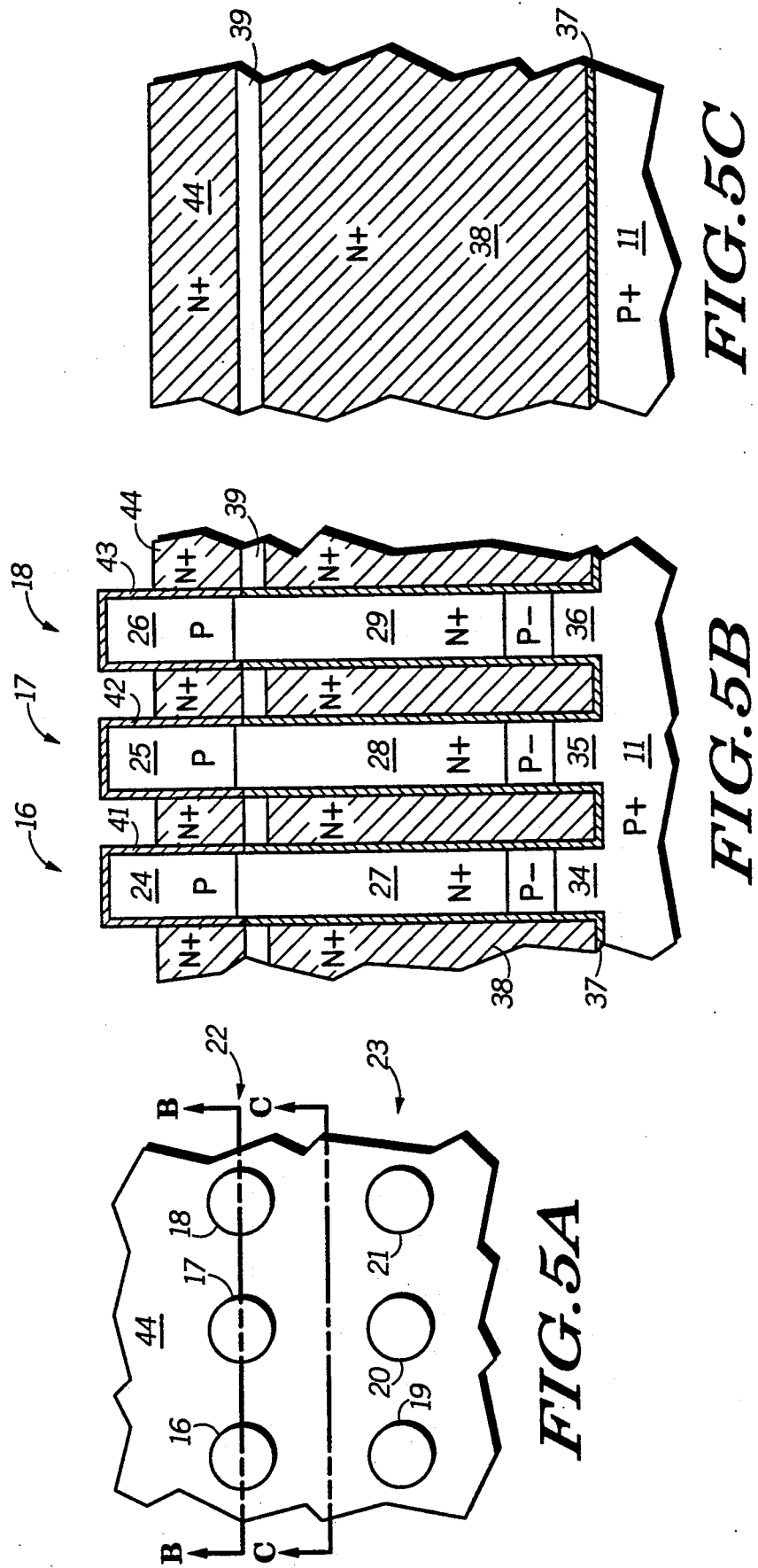

DRAM WITH A VERTICAL CAPACITOR AND TRANSISTOR

FIELD OF THE INVENTION

The invention relates to dynamic random access memories.

BACKGROUND OF THE INVENTION

Dynamic random access memories (DRAMs) have been an extremely important memory type for which there is an ever increasing need for more memory locations (increased density) per device. By far the most popular approach to making a DRAM cell is a planar cell in which a capacitor and a transistor are formed along the surface of a substrate. The typical approach for increasing cell density has been primarily to scale the planar cell as the ability to draw and process finer lines has improved.

Another approach has been to form one or both of the transistor and capacitor vertically, into the substrate. This approach has generally been referred to as trench because typically, the capacitor is formed within a "trench" which has been etched in the substrate. The trench approach is more difficult to manufacture but DRAMs using trenches have been successfully produced. The trench approach does provide more density but more difficult processing. There is thus a tradeoff analysis between the planar and trench approach. The current tradeoff favors the planar approach. Further improving the density of the trench approach would provide more favor for the trench approach and could reverse the tradeoff balance. For a simplistic example, if the yield for a trench cell was 45% and a planar cell was 90%, there would need to be twice as many die of the trench cell on a given wafer type than for the planar cell on the same wafer type for there to be the same number of good die of each cell type for a given wafer type. There are other factors also to consider such as complexity of equipment and how long it takes to process a wafer from start to finish (throughput). The improvement in density of the trench approach, however, would tend to make the tradeoff more favorable to the trench approach. There is thus a need to improve the density of the trench approach.

One of these improvement was to also make the transistor a vertical transistor as well as the capacitor a vertical capacitor. One such approach is described in article to supplied by the inventor. The approach in this article includes a field oxide region between transistors for the typical purpose of field oxide, to prevent adjacent transistors from being coupled together by a parasitic transistor. This field oxide region necessarily increases the amount of space necessary for a cell and thus reduces density.

SUMMARY OF THE INVENTION

Accordingly, it is an object of the present invention to provide an improved DRAM.

It is another object of the present invention to provide a DRAM with improved density.

It is yet another object of the present invention to provide an improved DRAM cell.

In carrying out these and other objects of the invention, there is provided, in one form, a memory cell formed on a semiconductor substrate which has a pillar of monocrystalline semiconductor material, a first insulating film, a conductive fill, an insulating layer, a second insulating film, and a conductive word line. The pillar extends from the substrate and has a first layer reaching a first height and which is a first conductivity type, a second layer above the first layer reaching a second height and which is a second conductivity type, and a third layer above the second layer reaching a third height and which is the first conductivity type. The first insulating film surrounds the pillar from the substrate to a fourth height. The fourth height is less than said first height. The conductive fill surrounds the pillar to a fifth height which is below the fourth height. The insulating layer is above the conductive fill and surrounds the pillar to the fourth height. The second insulating film surrounds the pillar from the fourth height to a sixth height which is above the second height but below the third height. The conductive word line at least partially surrounds the second layer of the pillar to a seventh height which is greater than the second height but less than the sixth height.

BRIEF DESCRIPTION OF THE DRAWINGS

FIGS. 1-9 show layout and cross-sections of an integrated circuit device at various stages in processing according to a preferred embodiment of the invention, each FIG. depicts a particular stage in the process and each FIG. is divided into A and B portions in which the A portion is a layout view of the integrated circuit device, and the B portion is a cross-section at a first location in the integrated circuit device. FIGS. 5 and 6 each further include a C portion. The C portion is a cross-section at a second location in the integrated circuit device.

DETAILED DESCRIPTION OF THE INVENTION

Figure 1A:
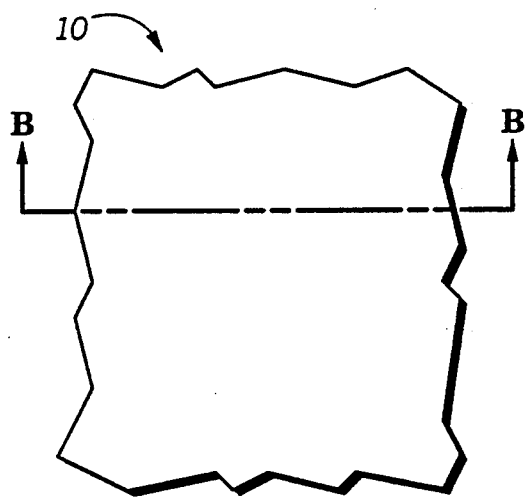
Figure 1B:
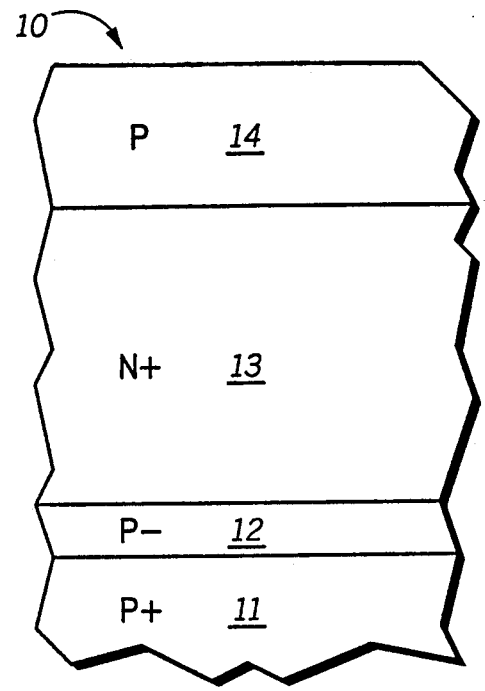

Shown in FIG. 1A and 1B is a portion 10 of a semiconductor device comprising a silicon substrate 11, a P−epitaxial layer 12 over substrate 11, an N+epitaxial layer 13 over epitaxial layer 12, and a P epitaxial layer 14 over epitaxial layer 13. Layers 11-13 are epitaxially grown so as to be monocrystalline and of the desired conductivity type and concentration. The preferred embodiment is described for a 0.5 micron technology in which finest line is 0.5 micron and the metal pitch and polysilicon pitch are both, center-to-center, 1.0 micron. For this technology, layer 12 is about 1 micron thick, layer 13 is about 7 microns thick, and layer 14 is about 3 microns thick. FIG. 1A is a layout of portion 10, and FIG. 1B is a cross section of portion 10 taken at B—B of FIG. 1A.

Figure 2A:
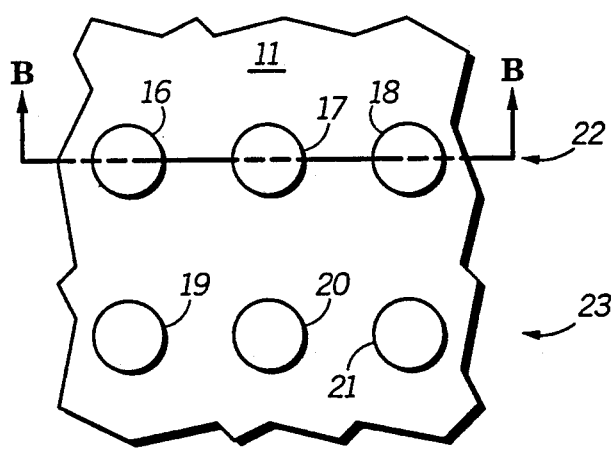
Figure 2B:
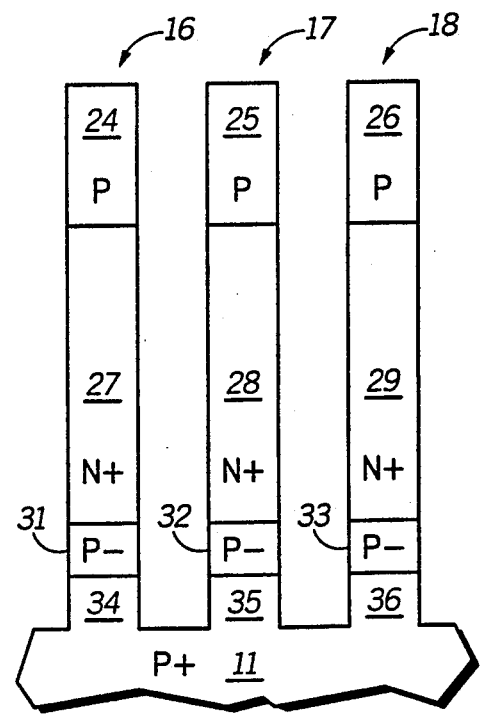

Portion 10 is then patterned and etched to leave pillars 16, 17, 18, 19, 20, and 21. This etch penetrates through layers 12-14 and into substrate 11 about 0.5 micron. Pillars 16-18 form a row 22, and pillars 19-21 form a row 23. Pillars 16-21 are shown in FIG. 2A and pillars 16-18 are shown in FIG. 2B. Pillars 16-21 are rounded in shape due to the mask and etch processes which tend to round corners which may desirably be more square. Pillars 16-21 are about 0.5 micron in diameter. Pillars 16-18 are spaced about 0.5 micron from each other, and pillars 19-21 are spaced about 0.5 micron from each other. Pillars 16-18 are spaced about 0.7 micron from pillars 19-21. The spacing of pillars within a row is about 0.5 micron. The spacing from pillars in one row is about 0.7 from pillars in an adjacent row. After the etch of layers 12-14, each pillar 16-21 has corresponding layers to etched layers 12-14. As shown in FIG. 2A, pillars 16–18 have P layers 24, 25, and 26, respectively, from layer 14; N+layers 27, 28, and 29, respectively, from layer 13; and P–layers 31, 32, and 33, respectively, from layer 12. Pillars 16–18 also have P+portions 34, 35, and 36, respectively, from substrate 11. This etch causes the portion of substrate 11 not covered by pillars 16–21 to be exposed.

Figure 3A:
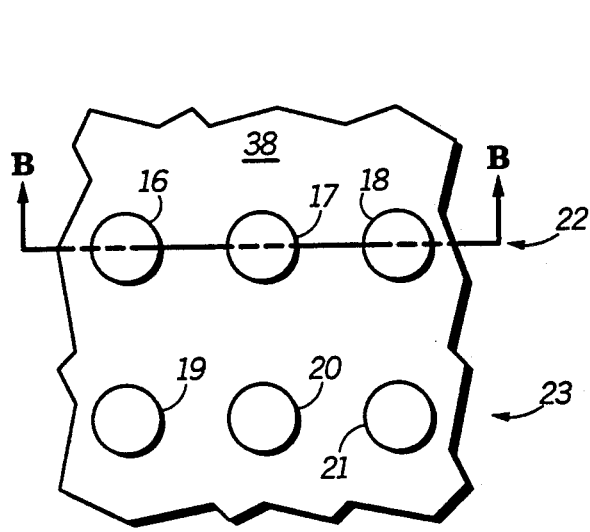
Figure 3B:
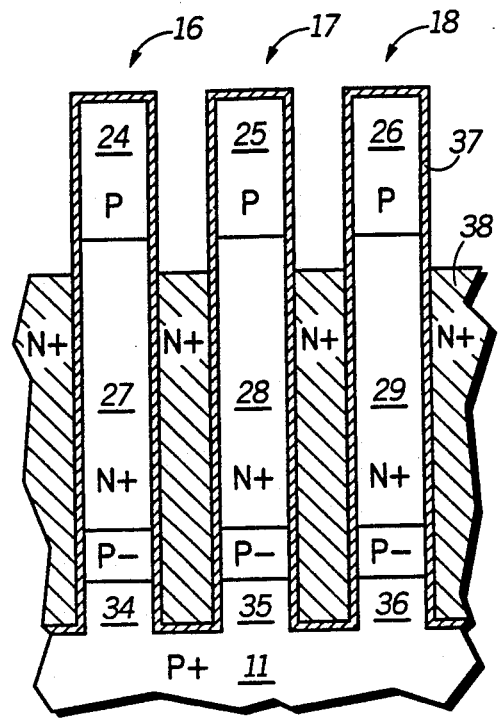

Pillars 16–21 and the exposed portion of substrate 11 are then coated with about 200 Angstroms of nitride to form an insulating layer 37 as shown in FIG. 3B. A different insulating material could also be used depending upon the particular characteristics that are desired such as dielectric coefficient breakdown voltage, manufacturability, and leakage. In the described embodiment insulating layer is exposed to oxygen to provide a very thin oxide layer over the nitride. Polysilicon doped to N+is then used to provide a conductive fill 38 which surrounds pillars 16–21 to a height which is about 0.7 microns below the height of N+layers 27–29. This is achieved by an etch back technique which is known in the semiconductor industry. A typical etch back process involves forming a relatively planar layer of a particular material over a surface which has peaks and valleys in which it is desired for the valleys to be covered with the particular material and the peaks to be exposed. The planar layer, because it is planar, is thinner over the peaks than over the valleys. A uniform etch of the planar layer thus causes the peaks to be exposed while still retaining the particular material in the valleys. The etch is then terminated before the particular material in the valleys is etched away but after the peaks have been exposed. Polysilicon is very conformal and is thus generally not particularly suitable for an etch back process. In the case of portion 10 as shown in FIGS. 2A and 2B, the spacing of pillars 16–21 can result in a nearly planar polysilicon layer before performing the etch thereof. The polysilicon, as it is coating the pillars, joins together. For the case where the pillars are 0.7 micron apart, a 0.35 micron polysilicon coating will cause the coatings of these adjacent pillars to merge. In such case the polysilicon between the pillars would be at least to the top of the pillars and the polysilicon over the pillars would be 0.35 micron. A uniform etch of 0.35 micron at that point would result in the tops of the pillars being exposed and the polysilicon between the pillars at 0.35 micron below the top of the pillars. Of course more than 0.35 micron of polysilicon coating is desired to ensure that the polysilicon between the pillars is sufficiently high to be sufficiently planar for the subsequent etch back. In the present case the etch back is to about 3.7 micron below the top of the pillars. Capacitors are formed between layers 27–29 and conductive fill 38 which is one of the objectives of the structure. The capacitance is directly related to the adjacent surface areas of layers 27–29 and conductive fill 38. Thus the critical height of conductive fill 38 is along the surface of insulating layer 37 and thus immediately adjacent to pillars 16–18. The height of conductive fill 38 can be less in the middle areas between pillars without deleteriously affecting capacitance. The etch back is desirably anisotropic using, for example, a reactive ion etch. This may result in the height of conductive layer 38 being nonuniform but the important height is that immediately adjacent to pillars 16–18.

Figure 4A:
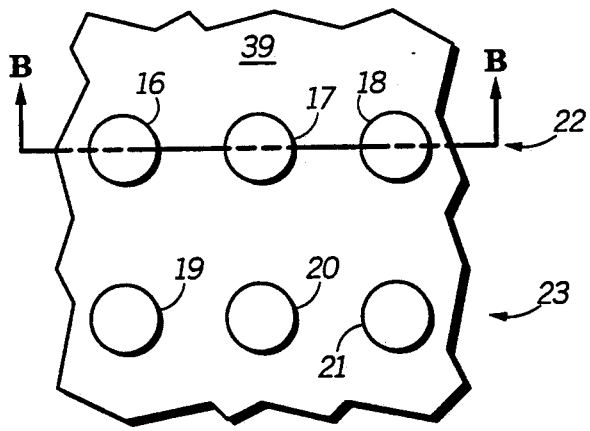
Figure 4B:
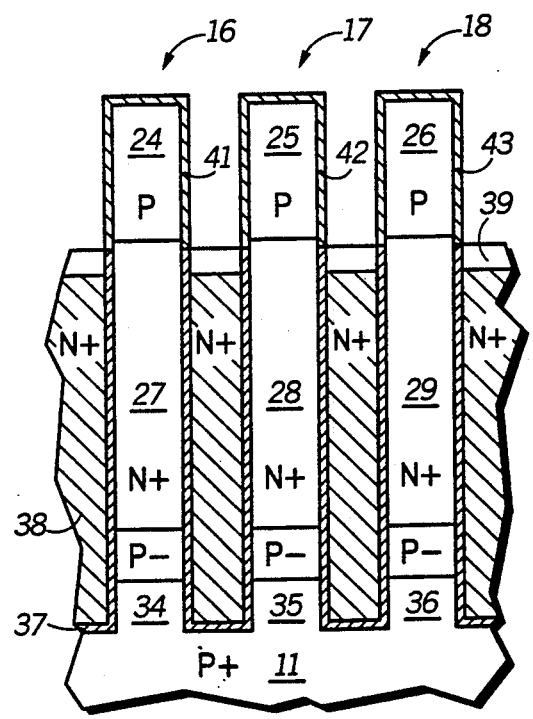

After formation of conductive fill 38, an insulating layer 39 of oxide is formed over conductive fill 38 and surrounding pillars 16–21 but still below P layers 23, 24, and 25. Insulating layer 39 is about 0.5 microns thick. Insulating layer 39 is formed by an oxidation process which is selective because insulating layer 37, which is nitride, protects pillars 16–21 from being oxidized. Because insulating layer 37 prevents the oxidation of the underlying silicon, oxide grows only on the top of exposed silicon such as N+polysilicon layers 27–29 as shown in FIG. 4B. Nitride-coated pillars 16–21 are exposed above insulating layer 39. Where nitride layer 37 coats the exposed portion of pillars 16–21, nitride layer 37 is etched away and oxide is grown to form gate insulator layers 41, 42, and 43 over pillars 16, 17, and 18. Oxide layers for gate insulators are also grown on pillars 19–21. The result of this oxidation of exposed silicon, nitride removal, and oxide growth is shown in FIGS. 4A and 4B. Gate insulators 41–43 are about 200 Angstroms.

A conductive layer 44 of polysilicon is formed using an etch-back process. Conductive layer 44 surrounds pillars 16–21 and is about 0.6 micron below the top of pillars 16–21 so that conductive layer 44 extends above insulating layer 39 but does not reach the top of pillars 16–21. Conductive layer 44 is about 2.6 micron thick. The result of forming conductive layer 44 is shown in FIGS. 5A, 5B, and 5C. FIG. 5C is a cross section taken at C—C of FIG. 5A which is between rows 22 and 23. A selective etch is then performed to remove conductive layer 42 between rows 22 and 23 to leave conductive rows 45 and 46. The result of this etch is shown in FIGS. 6A, 6B, and 6C. FIG. 6B is unchanged from FIG. 5B except that what was conductive layer 44 in FIG. 5B is conductive row 45 in FIG. 6B. FIGS. 6A and 6C show the removal of conductive layer 44 between rows 22 and 23. Conductive rows 45 and 46 are nominally centered over rows 22 and 23, respectively, but due to misalignment tolerances, reliance cannot be made on such intended centering. Thus, to ensure that conductive row 45 surrounds pillars 16–18, or at least substantially so, conductive row 45 is made to be 0.7 micron. Conductive rows 45 and 46 are about 0.5 micron apart which is considered the smallest pattern that can reliably be patterned and etched for a 0.5 micron technology. Conductive rows 45 and 46 operate as word lines in a memory array.

Figure 7A:
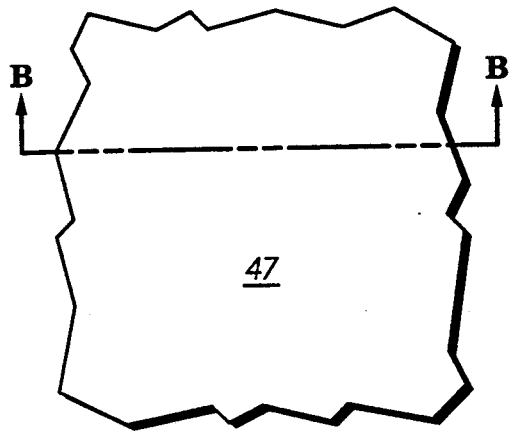
Figure 7B:
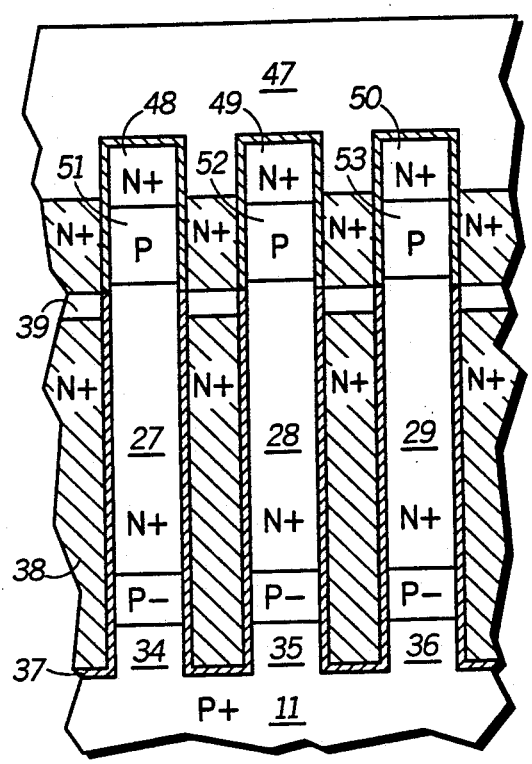
Figure 8A:
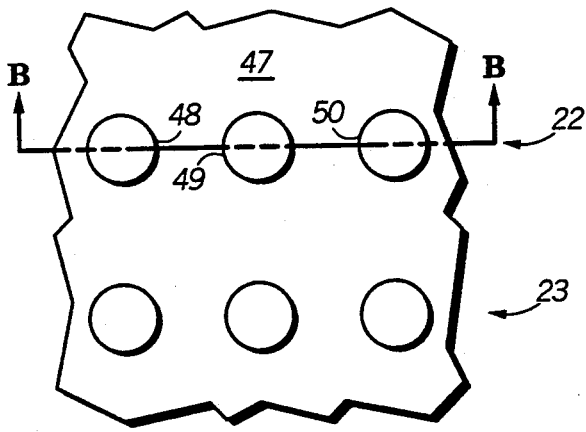
Figure 8B:
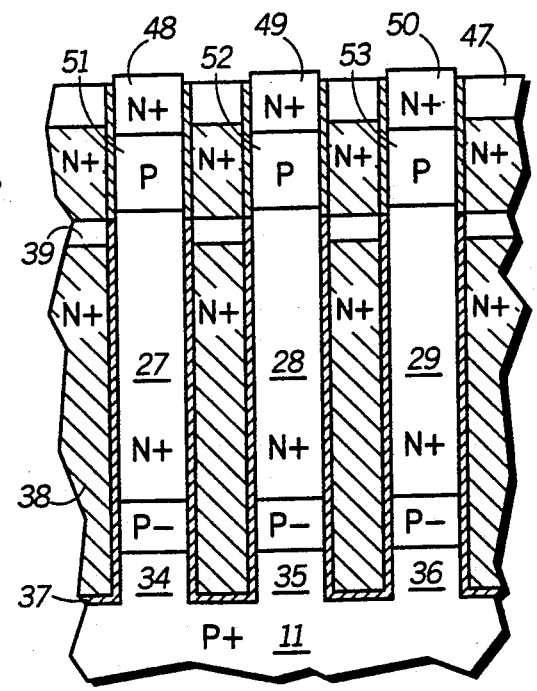

The top of pillars 16–21 are then implanted to form N+layers 48, 49, and 50 in the top of pillars 16, 17, and 18, respectively. This counterdopes the top portions of P layers 24, 25, and 26 to leave P layers 51, 52, and 53, under N+layers 48, 49, and 50, respectively. This is shown in FIG. 7B. A planar layer 47 of boro-phosphosilicate glass (BPSGH) is deposited and reflowed. BPSG is oxide with boron and phosphorus therein. The technique of reflowing is known for obtaining a very planar layer of glass. The resulting glass layer is even sometimes called reflow glass. This is shown in FIGS. 7A and 7B. Etching back planar layer 47 exposes P layers 24, 25, and 26 of the tops of pillars 16, 17, and 18, respectively. This etch also removes the portions of gate oxide 43 at the tops of N+layers 48–50 of pillars 16–18 because the etch material etches oxide whether BPSG or gate oxide. The etch is stopped after the tops of all of the pillars are exposed. End point detection using known laser refraction techniques can be used to determine when the tops of pillars 16–21 are exposed. The etch can continue a short time after it has been detected that the tops of pillars 16–21 have been exposed to ensure that the tops of all of the pillars have been exposed.

Figures 9A, 9B:
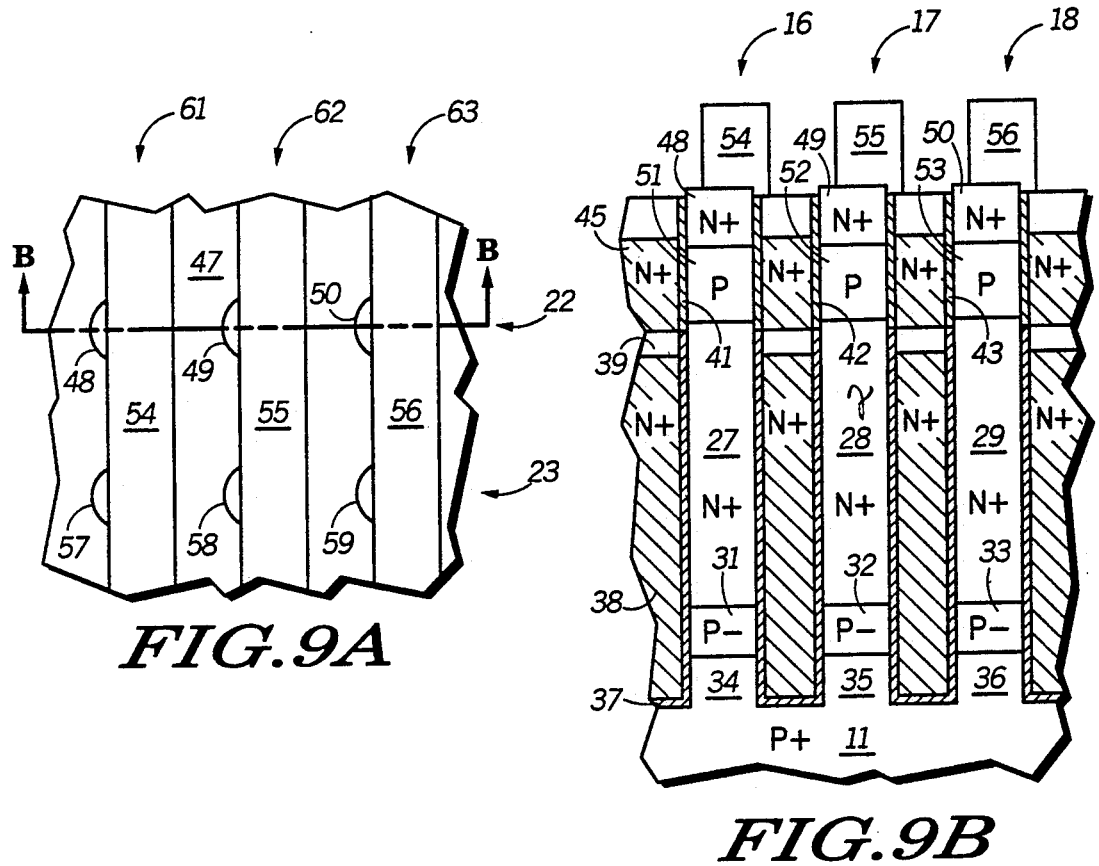

A metalization layer is then formed and etched to leave conductive lines 54, 55, and 56 in contact with pillars 16–21 as shown in FIGS. 9A and 9B. Conductive lines 54–56 are orthogonal to conductive row lines 22 and 23. When N+layers 48–50 were formed in the tops of pillars 16–18, N+layers 57, 58, and 59 were also formed in the tops of pillars 19, 20, and 21, respectively. A column 61 is formed from N+layers 48 and 57, a column 62 is formed from N+layers 49 and 58, and a column 63 is formed from N+layers 50 and 59. Conductive lines 54, 55, and 56 are 0.5 micron wide and nominally centered about columns 61, 62, and 63, respectively, and misaligned by about 0.1 micron as shown in FIGS. 9A and 9B. Conductive line 54 is in physical contact, and thus electrical contact with N+layers 48 and 57. Similarly, conductive line 55 is in physical and electrical contact with N+layers 49 and 58. Conductive line 56 is in physical and electrical contact with N+layers 50 and 59.

Portion 10 of the integrated circuit device as shown in FIGS. 9A and 9B is a dynamic random access memory (DRAM) array having six memory cells. Of course an array could be made much larger. Each pillar 16–21 is a memory cell having a transistor and a capacitor plate. Conductive fill 38 operates as a second capacitor plate for all six memory cells. Pillar 18, for example, has a transistor formed from N+layer 50 as a first source/drain, P layer 53 as a channel, N+layer 29 as a second source/drain, oxide 43 as a gate insulator, and conductive row 45 as a gate. A capacitor is formed in which N+layer 29 operates as a first capacitor plate, nitride layer 37 operates as a dielectric, and conductive fill 38 operates as the second plate. N+layer 29 thus operates both as a source/drain and as a capacitor plate. Conductive fill 38 is connected to a reference voltage. Conductive fill 38 can have convenient connection points by masking off portions during the etch back process so that those masked off portions will be accessible at the surface of the device. Since conductive fill 38 surrounds N+layer 29 for most of the height of N+layer 29, there is substantial capacitance for the small amount of surface area required of pillar 18. Memory cells are comprised similarly from pillars 16, 17, and 19–21. Applying a positive voltage of, for example, 5 volts to conductive row 45, and thus enabling it as a word line, will cause N+regions 27–29 as first capacitor plates to be coupled to conductive lines 54–56, respectively. Conductive lines 54–56 operate as bit lines from which the first capacitor plates of N+layers 27–29 can be accessed for carrying charge from for reading or providing charge to for writing, and thus operate as a DRAM array.

P-layers 31–33 are for increasing the junction breakdown voltage between substrate and N+layers 27–29. The lower doping level of P- for layers 31–33 improves PN junction breakdown. Substrate 11 is higher doped to P+ to improve its channel stop characteristic. This is a potentially deleterious parasitic transistor between the pillars. For example, there is a parasitic transistor between N+layer 29 and 28 in which the channel comprises P-layer 32, P−layer 33, and P+substrate 11, and conductive fill 38 is the gate. The P+doping level of substrate is to ensure that the threshold voltage of this parasitic transistor is sufficiently high to avoid leakage therethrough.

While the invention has been described in a specific embodiment, it will be apparent to those skilled in the art that the disclosed invention may be modified in numerous ways and may assume many embodiments other than those specifically set out and described above. For example conductive fill may be a different material than polysilicon. It may be feasible to eliminate P-regions 31–33. The doping concentration of substrate 11 may be reduced. Accordingly, it is intended by the appended claims to cover all modifications of the invention which fall within the true spirit and scope of the invention.

I claim:

1. A memory array formed in a semiconductor substrate having a first conductivity type and a first doping concentration, comprising:

a plurality of conductive bit lines;

a plurality of pillars of monocrystalline semiconductor material extending from the substrate, each having a first layer reaching a first height and which is the first conductivity type and of a second doping concentration which is less than the first doping concentration, a second layer above the first layer reaching a second height and which is a second conductivity type, a third layer above the second layer reaching a third height and which is the first conductivity type, and a fourth layer above the third layer reaching a fourth height and in contact with a corresponding one of the plurality of conductive bit lines;

a conductive fill insulated from and surrounding the plurality of pillars to a fifth height which is below the second height;

an insulating layer above the conductive fill and surrounding the plurality of pillars to a sixth height which is below the second height; and a plurality of conductive word lines insulated from and at least partially surrounding the third layers of corresponding pillars of the plurality of pillars to a seventh height which is greater than the third height but less than the fourth height.

2. The memory of claim 1 wherein the substrate is of the second conductivity type and has a first doping concentration, and wherein each of the plurality of pillars further comprises a fourth layer of the second conductivity type between the first layer and the substrate, said fourth layer being of a second doping concentration.

3. The memory of claim 2 wherein the second doping concentration is less than the first doping concentration.

4. The memory of claim 1 further comprising an insulating fill over the plurality of conductive word lines to a height less than the fourth height.

5. A memory array formed in a semiconductor substrate having a first conductivity type and a first doping concentration, comprising:

a plurality of conductive bit lines;

a plurality of pillars of monocrystalline semiconductor material extending from the substrate, each having a first layer reaching a first height and which is the first conductivity type and of a second doping concentration which is less than the first doping concentration, a second layer above the first layer reaching a second height and which is a second conductivity type, a third layer above the second layer reaching a third height and which is the first conductivity type, and a fourth layer above the third layer reaching a fourth height and in contact with a corresponding one of the plurality of conductive bit lines;

a plurality of first insulating films, each first insulating film surrounding a corresponding one of the plurality of pillars from the substrate to a fourth height, said fourth height being less than said first height;

a conductive fill insulated from and surrounding the plurality of pillars to a fifth height which is below the second height;

an insulating layer above the conductive fill and surrounding the plurality of pillars to a sixth height which is below the second height;

a plurality of second insulating films, each second insulating film surrounding a corresponding pillar from the fifth height to a seventh height which is above the third height but below the fourth height; and a plurality of conductive word lines insulated from and at least partially surrounding the third layers of corresponding pillars of the plurality of pillars to the seventh height.

6. The memory of claim 5 wherein the substrate is of the second conductivity type and has a first doping concentration, and wherein each of the plurality of pillars further comprises a fourth layer of the second conductivity type between the first layer and the substrate, said fourth layer being of a second doping concentration.

7. The memory of claim 6 wherein the second doping concentration is less than the first doping concentration.

8. The memory of claim 5 further comprising an insulating fill over the plurality of conductive word lines to a height less than the fourth height.

9. A memory cell formed on a semiconductor substrate, comprising:

a pillar of monocrystalline semiconductor material extending from the substrate having a first layer reaching a first height and which is the first conductivity type and of a second doping concentration which is less than the first doping concentration, a second layer above the first layer reaching a second height and which is a second conductivity type, a third layer above the second layer reaching a third height and which is the first conductivity type, and a fourth layer above the third layer reaching a fourth height;

an insulating film surrounding the pillar from the substrate to a fifth height, said fifth height being less than said second height;

a conductive fill surrounding the pillar to a sixth height which is below the fifth height;

an insulating layer above the conductive fill and surrounding the pillar to the fifth height;

a second insulating film surrounding the pillar from the fifth height to a seventh height which is above the third height but below the fourth height; and a conductive word line at least partially surrounding the third layer of the pillar to an eighth height which is greater than the third height but less than the seventh height.

10. The memory of claim 9 wherein the substrate is of the second conductivity type and has a first doping concentration the pillar further comprises a fourth layer of the second conductivity type between the first layer and the substrate, said fourth layer being of a second doping concentration.

11. The memory of claim 10 wherein the second doping concentration is less than the first doping concentration.

12. The memory of claim 9 further comprising an insulating fill over the plurality of conductive word lines to a height less than the fourth height.

* * * * *